(12) United States Patent
Bi et al.

(10) Patent No.: US 9,837,408 B1
(45) Date of Patent: Dec. 5, 2017

(54) FORMING STRAINED AND UNSTRAINED FEATURES ON A SUBSTRATE

(71) Applicant: International Business Machines Corporation, Armonk, NY (US)

(72) Inventors: Zhenxing Bi, Niskayuna, NY (US); Kangguo Cheng, Schenectady, NY (US); Peng Xu, Guilderland, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 9 days.

(21) Appl. No.: 15/278,420

(22) Filed: Sep. 28, 2016

(51) Int. Cl.
- *H01L 27/088* (2006.01)
- *H01L 21/8234* (2006.01)
- *H01L 21/02* (2006.01)
- *H01L 21/306* (2006.01)
- *H01L 29/16* (2006.01)
- *H01L 29/78* (2006.01)

(52) U.S. Cl.
CPC .... *H01L 27/0886* (2013.01); *H01L 21/02381* (2013.01); *H01L 21/02532* (2013.01); *H01L 21/30604* (2013.01); *H01L 21/823431* (2013.01); *H01L 21/823437* (2013.01); *H01L 29/16* (2013.01); *H01L 29/7849* (2013.01)

(58) Field of Classification Search
CPC ........... H01L 29/66795; H01L 29/7849; H01L 29/7848; H01L 29/7851
See application file for complete search history.

(56) References Cited

U.S. PATENT DOCUMENTS

| | | | |
|---|---|---|---|
| 7,384,830 B2 | 6/2008 | Cohen | |
| 7,388,259 B2 | 6/2008 | Doris et al. | |
| 8,183,627 B2 | 5/2012 | Currie | |
| 8,841,178 B1 | 9/2014 | Basker et al. | |
| 8,847,281 B2 | 9/2014 | Cea et al. | |
| 8,952,420 B1 | 2/2015 | Loubet et al. | |
| 9,099,559 B2 | 8/2015 | Morin | |
| 9,202,894 B1 | 12/2015 | Zang | |
| 2015/0028349 A1 | 1/2015 | Loubet et al. | |
| 2015/0162435 A1 | 6/2015 | Sahu et al. | |
| 2015/0333155 A1 | 11/2015 | Liu et al. | |
| 2016/0315172 A1* | 10/2016 | Wu | H01L 29/0847 |
| 2016/0359043 A1* | 12/2016 | Chen | H01L 29/7851 |

* cited by examiner

*Primary Examiner* — Selim Ahmed
*Assistant Examiner* — Evan Clinton
(74) *Attorney, Agent, or Firm* — Cantor Colburn LLP; Vazken Alexanian (57) ABSTRACT

Embodiments are directed to a method of forming features of a semiconductor device. The method includes forming a first feature including a first type of semiconductor material, which can be tensile or can have compressive strain. The method further includes forming an enclosure structure including a second type of semiconductor material, wherein the first feature includes first feature sidewall surfaces extending around a circumference of the first feature. The enclosure structure is adjacent at least a portion of the first feature sidewall surfaces and extends around the circumference of the first feature.

20 Claims, 12 Drawing Sheets

FORMING STRAINED AND UNSTRAINED FEATURES ON A SUBSTRATE

BACKGROUND

The present invention relates in general to semiconductor devices for use in integrated circuits (ICs). More specifically, the present invention relates to improved fabrication methodologies and resulting structures for semiconductor device configurations (e.g., fin-type field effect transistors (FinFETs)) having strained and unstrained semiconductor device features formed on the same substrate.

Transistors are fundamental device elements of modern digital processors and memory devices. There are a variety of transistor types and designs that can be used for different applications, including, for example, bipolar junction transistors (BJT), junction field-effect transistors (JFET), and metal-oxide-semiconductor field-effect transistors (MOSFET). One type of transistor that has emerged within the MOSFET family of transistors, and which shows promise for scaling to ultra-high density and nanometer-scale channel lengths, is a so-called FinFET device. The use of silicon germanium in semiconductor devices such as FinFETs provides desirable device characteristics, including the introduction of strain at the interface between the silicon germanium of the active device and the underlying silicon substrate.

SUMMARY

Embodiments are directed to a method of forming features of a semiconductor device. The method includes forming a first feature including a first type of semiconductor material. The method further includes forming an enclosure structure including a second type of semiconductor material, wherein the first feature includes first feature sidewall surfaces extending around a circumference of the first feature. The enclosure structure is adjacent at least a portion of the first feature sidewall surfaces and extends around the circumference of the first feature.

Embodiments are directed to a method of forming features of a semiconductor device. The method includes forming a first feature on a substrate, wherein the first feature and the substrate include a first type of semiconductor material. The method further includes forming a trench in the first feature, wherein the trench defines sidewall structures in the first feature that surround the trench. The method further includes forming a second feature that includes a second type of semiconductor material, wherein forming the second feature includes filling the trench with the second type of material.

Embodiments are further directed to a semiconductor device that includes a substrate formed from a first type of semiconductor material. The device further includes a first feature on the substrate, wherein the first feature is formed from the first type of semiconductor material. The device further includes a trench in the first feature, wherein the trench defines sidewall structures in the first feature that surround the trench. The device further includes a second feature within the trench, wherein the second feature is formed from a second type of semiconductor material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

It is understood in advance that, although this detailed description includes p-type and n-type FinFET devices having silicon germanium and silicon fins, implementation of the teachings recited herein are not limited to a particular type of FET structure or semiconductor material. Rather, embodiments of the present invention are capable of being implemented in conjunction with any other type of fin-based transistor device or semiconductor material, now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication embodiments of the present invention utilize a variety of individually known physical and chemical processes performed on a semiconductor (e.g., silicon) substrate, some of which are described in the following immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
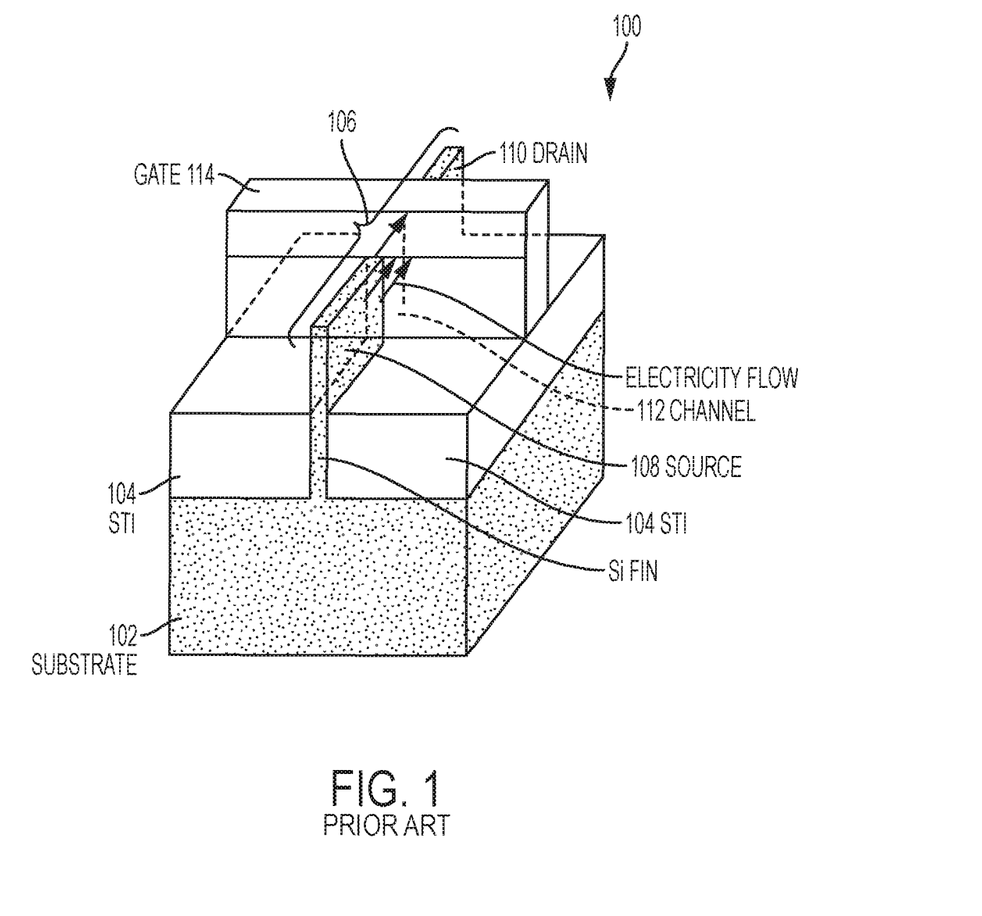
FIG. 1 depicts a three-dimensional view of an example configuration of a known FinFET device.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., Silicon oxide) and fin 106 can be silicon that has been enriched to a desired concentration level of germanium. Gate 114 controls the source to drain current flow (labeled ELECTRICITY FLOW in FIG. 1).

In contrast to planar MOSFETs, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

The use of silicon germanium in semiconductor devices provides desirable device characteristics, including the introduction of strain in a silicon germanium channel to enhance carrier mobility and thus transistor performance. The compressive strain (typically expressed as a percentage) introduced by using silicon germanium in the active region of a semiconductor device is based on the concentration of germanium introduced into the silicon. For example, a silicon germanium feature (e.g., a fin) having a 25% concentration of germanium can exhibit a nominal compressive strain of 0.01 (or 1%) with a +/−5% variation. It is desirable to substantially maintain the compressive strain within a predetermined variation throughout the volume of the feature.

However, when silicon germanium fins are cut into desired lengths to meet device and/or IC design requirements, strain relaxes at the ends of the fin ends. For example, in a silicon germanium feature (e.g., a fin) having a 25% concentration of germanium and a nominal compressive strain of 0.01 (or 1%) with a +/−5% variation throughout its uncut volume, when the feature is cut to meet design requirement, the compressive strain at the cut ends of the feature is relaxed outside the +/−5% variation. In some cases, the compressive strain loss at the cut ends of a silicon germanium fin can be 50%. The loss of compressive strain at the ends of the silicon germanium feature causes device degradation and variation. Accordingly, there is a need to fabricate strained semiconductor device features having the desired dimensions but minimizing the relaxation or removal of compressive strain from the ends of the feature.

Turning now to an overview of aspects of the present invention, one or more embodiments provide a feature fabrication methodology for fabricating a strained silicon germanium fin having the desired dimensions but minimizing the relaxation or loss of compressive strain from the ends of the fin. In one or more embodiments, a protective silicon shield (or ring or shell) is provided around a circumference of the strained silicon germanium fin. The dimensions of an inner surface of the silicon shield define the dimensions of the silicon germanium fin. By selecting the dimensions of the inner surface of the silicon shield to match the desired dimensions of the silicon germanium fin in the final FET device, the silicon germanium fin does not have to be cut to the final FET dimension requirements. Because the strained silicon germanium fin does not have to be cut, compression strain is maintained throughout the strained silicon germanium fin. In addition, the silicon shield protects the silicon germanium fin from downstream FET fabrication processes such as cleaning and etching that would otherwise result in excessive silicon germanium thinning.

In one or more embodiments, the shield is formed by an initial fin structure on a substrate. In one or more embodiments, the initial fin structure is the same semiconductor material as the substrate, so there is substantially no compressive strain in the initial fin structure. A trench is formed in the initial fin structure, and the sidewalls and bottom surface of the trench act as the shield. The length and width dimensions of the trench are selected to match the length and width dimensions of the desired final, strained fin structure. Silicon germanium having a predetermined percentage of compressive strain with a predetermined +/− variation in the compressive strain level is grown in the trench. The epitaxially grown silicon germanium fills at least a portion of the trench such that the epitaxially grown silicon germanium has the length and width dimensions defined by the trench, which has the desired length and width dimensions of the final, strained fin structure. Accordingly, the epitaxially grown silicon germanium has the desired length and width dimensions of the final, strained fin structure, and will, after subsequent fabrication steps, function as the final strained silicon germanium fin structure in the final p-type FinFET device. The strained fin structure is never physically cut, so there is no compressive strain relaxation at the end of the strained fin structure. Additionally, the shield protects the strained silicon germanium fin from downstream FET fabrication processes (e.g., cleaning, etching, etc.) that would potentially etch some of the epitaxially grown silicon germanium fin, which further ensures that the desired length and width dimensions of the final strained silicon germanium fin is maintained.

Turning now to a more detailed description of aspects of the present invention, a methodology for fabricating features 200 in and on a semiconductor substrate 202 according to one or more embodiments of the present invention will now be described with reference to FIGS. 2A-12. In one or more embodiments, features 200 will be, after completion of the described fabrication processes, n-type FETs having unstrained fins and p-type FETs having strained fins. FIGS. 2A-11C depict top-down and cross-sectional views of features 200 after various fabrication stages in accordance with one or more embodiments. FIG. 12 depicts a flow diagram illustrating a fabrication methodology 1200 according to one or more embodiments. A description of exemplary fabrication methodologies for forming features 200 shown in FIGS. 2A-11C according to one or more embodiment of the present invention will now be provided with reference to the fabrication stages shown in FIGS. 2A-11C.

Figure 2A:
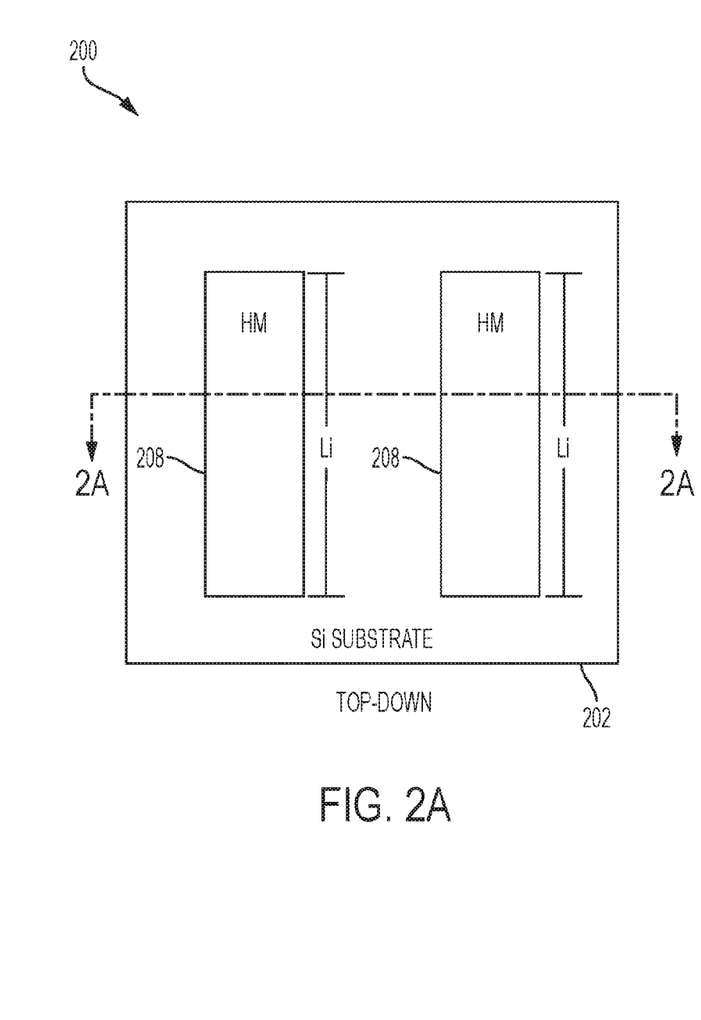
FIG. 2A depicts a top-down view of an initial fabrication stage for a fin configuration according to one or more embodiments.
Figure 2B:
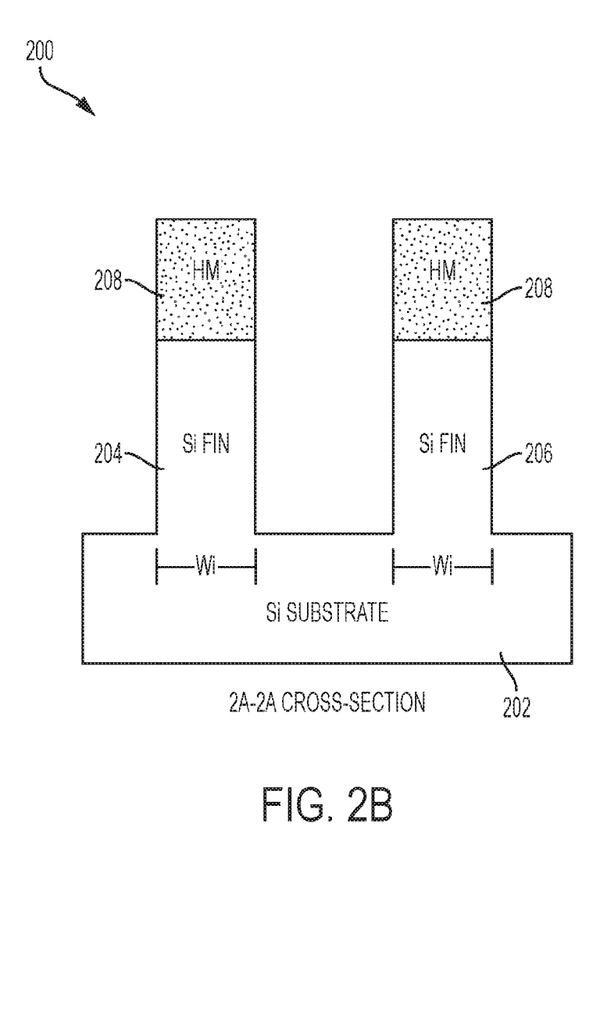
FIG. 2B depicts a cross-sectional view of the fin shown in FIG. 2A, taken along line 2A-2A.

FIG. 2A depicts a top-down view of features 200 after an initial fabrication stage according to one or more embodiments. FIG. 2B depicts a cross-sectional view of features 200 shown in FIG. 2A, taken along line 2A-2A. In one or more embodiments, features 200 will be, after completion of the fabrication process, one or more of an n-type FET (NFET) having an unstrained silicon fin, and/or a p-type FET (PFET) having a strained silicon germanium fin. As best shown in FIG. 2B, a hard mask layer (not shown) is formed over substrate 202. The hard mask layer is patterned, and then hard masks (HM) 208 and unstrained silicon fins 204, 206 are formed by any suitable fin formation process (e.g., applying an anisotropic etch process). Hard masks 208 can be a silicon nitride material (e.g., $Si_3Ni_4$) or any other suitable material(s).

Figure 7A:
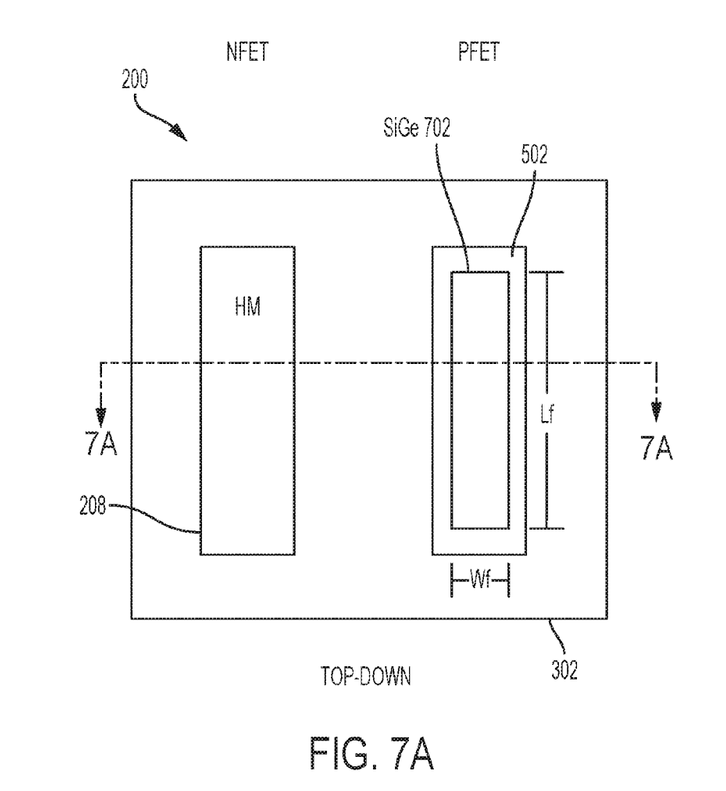
FIG. 7A depicts a top-down view of an intermediate fabrication stage for a fin configuration according to one or more embodiments.
Figure 7B:
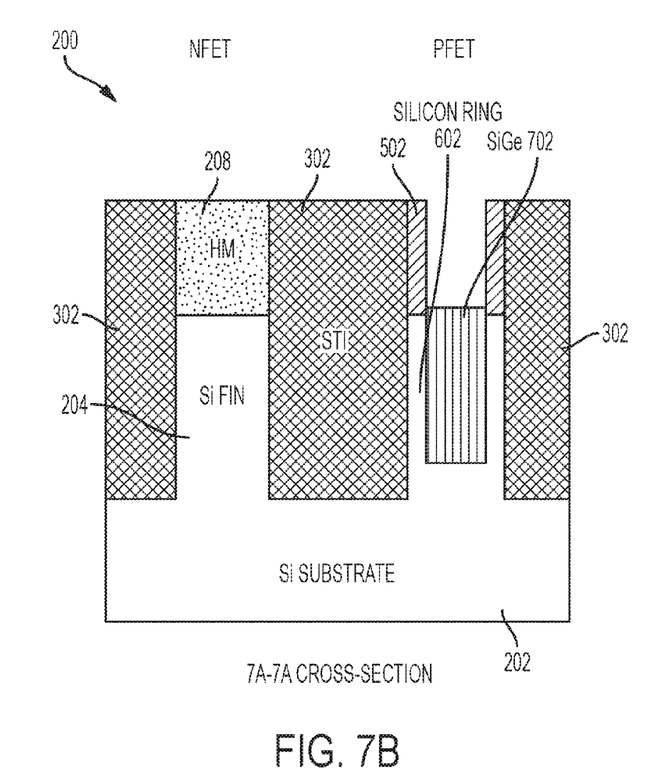
FIG. 7B depicts a cross-sectional view of the fin shown in FIG. 7A, taken along line 7A-7A.

The initial fin dimensions, and particularly the initial width dimension Wi, and the initial length dimension Li of the silicon fins 204, 206, are selected to be greater than the desired final fin dimensions (e.g., the final width dimension Wf and the final length dimension Lf of the silicon fin 204 and the yet-to-be-formed silicon germanium fin 702, which is shown in FIGS. 7A and 7B). It is noted that the initial length dimension Li of the silicon fins 204, 206 is shown in FIG. 2A. Although the silicon fins 204, 206 are not visible in FIG. 2A, the silicon fins 204, 206 are positioned directly beneath the hard masks 208, and their initial length dimensions Li are substantially the same as the initial length dimensions Li of the hard masks 208. In order to account for undesired fin loss caused by downstream fabrication processes (e.g., cleaning, etching, etc.), if the expected fin loss during fabrication is approximately X, and if the desired final fin dimension is approximately Y, the initial fin dimension is selected to be approximately X+Y.

Figure 3A:
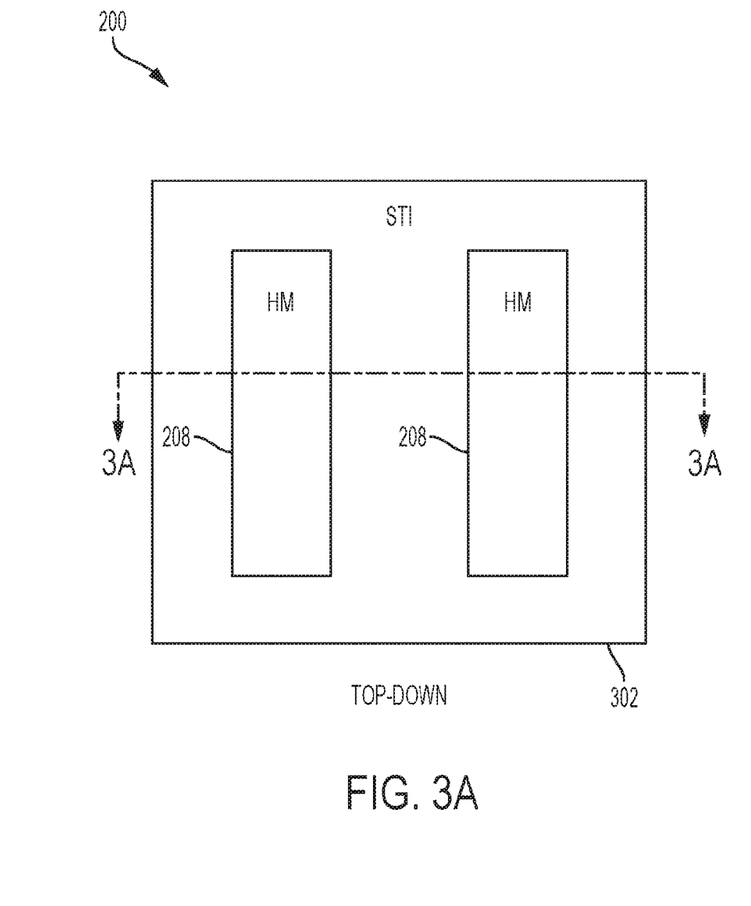
FIG. 3A depicts a top-down view of an intermediate fabrication stage for a fin configuration according to one or more embodiments.
Figure 3B:
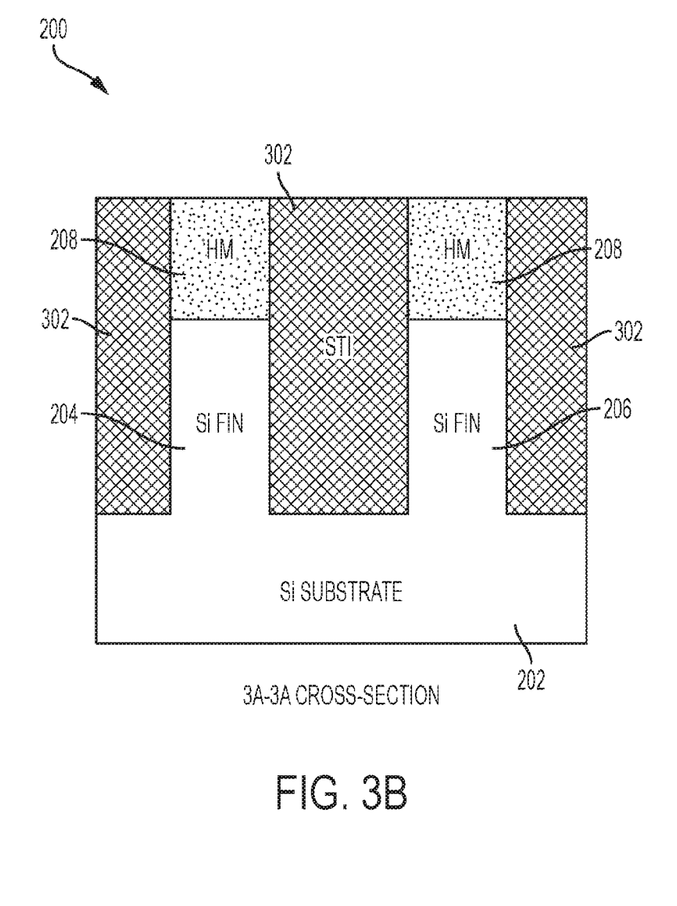
FIG. 3B depicts a cross-sectional view of the fin shown in FIG. 3A, taken along line 3A-3A.

FIG. 3A depicts a top-down view of features 200 after an intermediate fabrication stage according to one or more embodiments. FIG. 3B depicts a cross-sectional view of features 200 shown in FIG. 3A, taken along line 3A-3A. As best shown in FIG. 3B, a local dielectric isolation (e.g., silicon oxide, or silicon nitride in combination with silicon oxide) is deposited between fins 204, 206 and over substrate 202. The local dielectric is polished and recessed back to form STI regions 302.

Figure 4A:
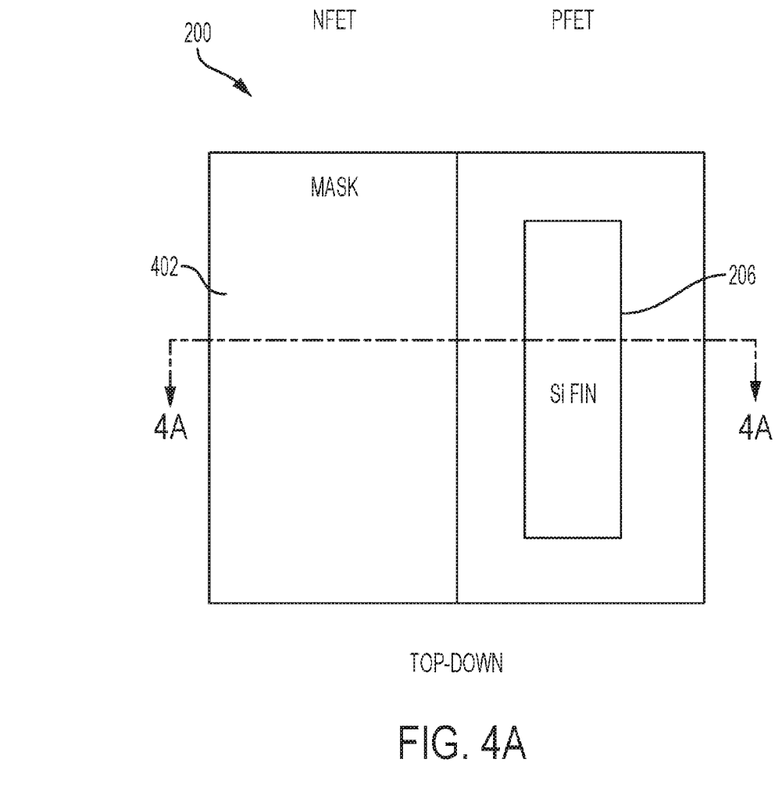
FIG. 4A depicts a top-down view of an intermediate fabrication stage for a fin configuration according to one or more embodiments.
Figure 4B:
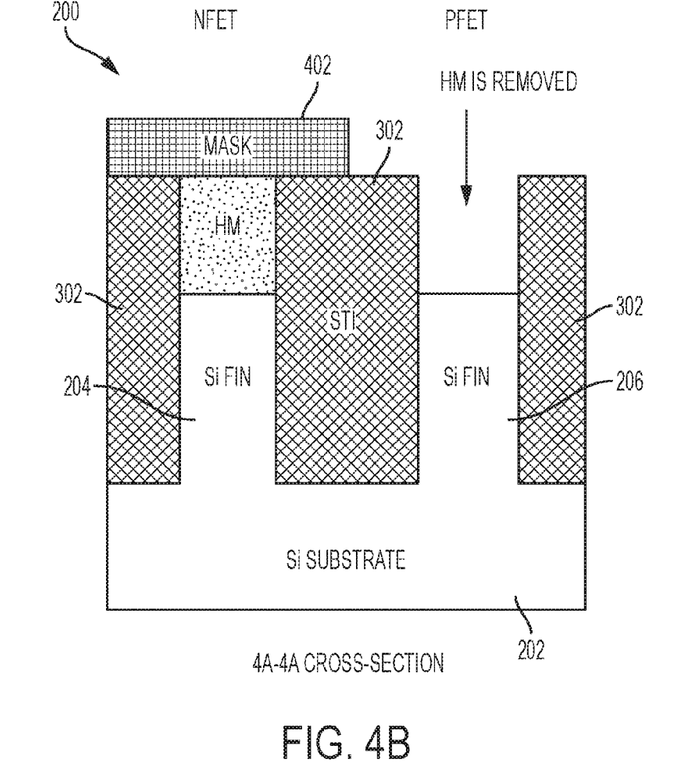
FIG. 4B depicts a cross-sectional view of the fin shown in FIG. 4A, taken along line 4A-4A.

FIG. 4A depicts a top-down view of features 200 after another intermediate fabrication stage according to one or more embodiments. FIG. 4B depicts a cross-sectional view of features 200 shown in FIG. 4A, taken along line 4A-4A. As best shown in FIG. 4B, a mask 402 is deposited over the portion of features 200 that will form an n-type FET, and the hard mask 208 over silicon fin 206 is removed to expose a top surface of silicon fin 206.

Figure 5A:
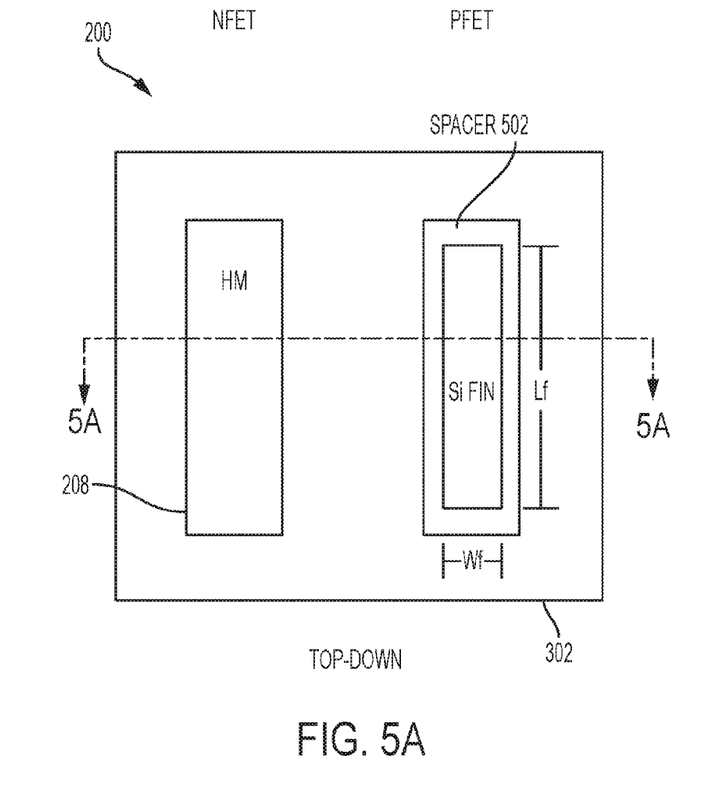
FIG. 5A depicts a top-down view of an intermediate fabrication stage for a fin configuration according to one or more embodiments.
Figure 5B:
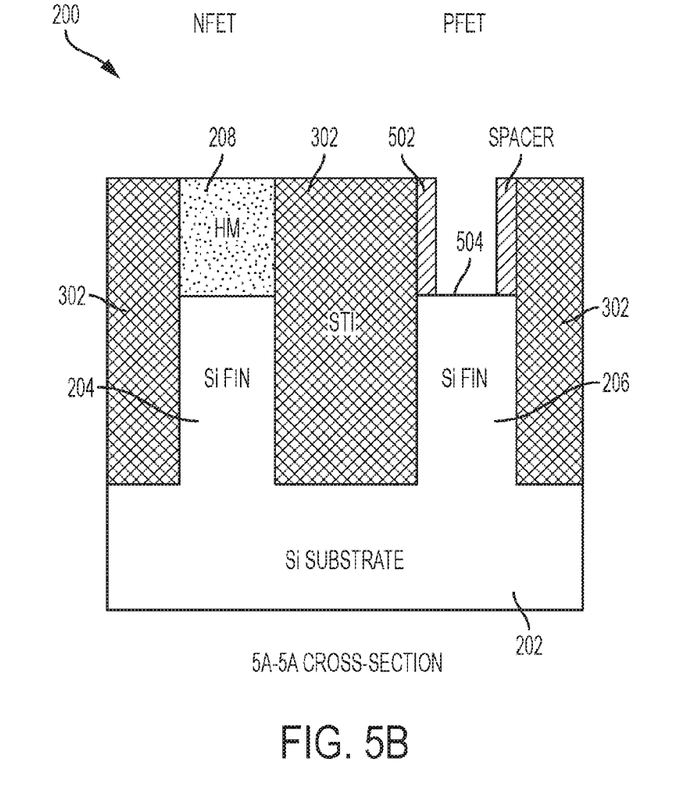
FIG. 5B depicts a cross-sectional view of the fin shown in FIG. 5A, taken along line 5A-5A.

FIG. 5A depicts a top-down view of features 200 after another intermediate fabrication stage according to one or more embodiments. FIG. 5B depicts a cross-sectional view of features 200 shown in FIG. 5A, taken along line 5A-5A. As best shown in FIG. 5B, mask 402 has been removed, and a sidewall spacer 502 is formed along sidewalls of STI 302 above silicon fine 206. Sidewall spacer 502 can be any suitable material, including for example a nitride material. Sidewall spacer 502 can be formed by depositing the nitride material (not shown) followed by a direction etch to the nitride material to form sidewall spacers 502. For reasons that will be explained later in this process description, in one or more embodiments, the thickness of sidewall 502 is selected to match or exceed the amount of expected silicon loss that will result from processing silicon fin 206 to form a p-type FET. Additionally, for reasons that will be explained later in this process description, in one or more embodiments, the length and width dimensions of an exposed portion of a top surface 504 of silicon fin 206 are selected to match the desired final length Lf and desired final width Wf of the yet-to-be-formed silicon germanium fin 702 (shown in FIGS. 7A and 7B).

Figure 6A:
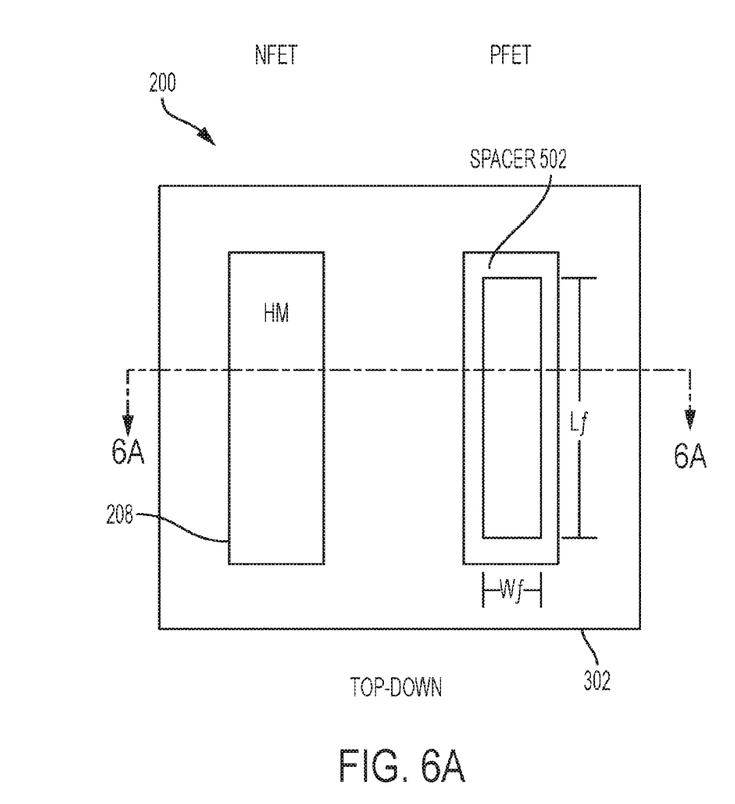
FIG. 6A depicts a top-down view of an intermediate fabrication stage for a fin configuration according to one or more embodiments.
Figure 6B:
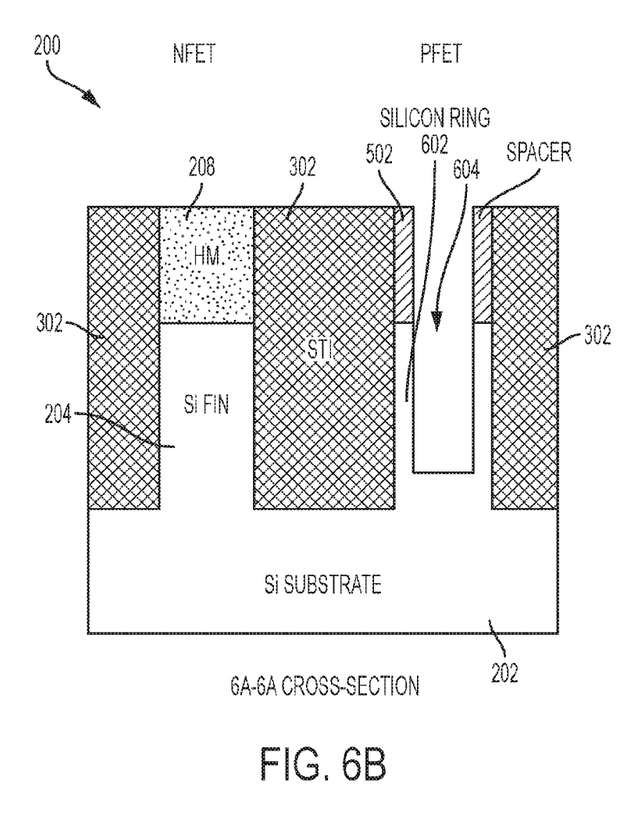
FIG. 6B depicts a cross-sectional view of the fin shown in FIG. 6A, taken along line 6A-6A.

FIG. 6A depicts a top-down view of features 200 after another intermediate fabrication stage according to one or more embodiments. FIG. 6B depicts a cross-sectional view of features 200 shown in FIG. 6A, taken along line 6A-6A. As best shown in FIG. 6B, a directional etch selective to silicon is applied to the top surface 504 of silicon fin 206 to form a trench 604. Sidewall spacer 502 acts as a mask to transfer the length Lf and the width Wf dimensions defined within sidewall spacer 502 to trench 604. Sidewall spacer 502 also acts as a mask to transfer the thickness of sidewall spacer 502 to a portion of silicon fin 206 that forms a silicon shield or ring 602. As noted above, the thickness of sidewall 502 is selected to match or exceed the expected amount of silicon loss that will result from processing silicon fin 206 to form a p-type FET. Accordingly, the thickness of silicon shield 602 also matches or exceeds the expected amount of silicon loss that will result from processing silicon fin 206 to form a p-type FET. As further noted above, Lf and Wf are selected to match the desired final length Lf and desired final width Wf of the yet-to-be-formed silicon germanium fin 702 (shown in FIGS. 7A and 7B). Because there is no stop layer in silicon fin 206, the etch process is time based.

FIG. 7A depicts a top-down view of features 200 after another intermediate fabrication stage according to one or more embodiments. FIG. 7B depicts a cross-sectional view of features 200 shown in FIG. 7A, taken along line 7A-7A. As best shown in FIG. 7B, silicon germanium is epitaxially grown within trench 604 to form a silicon germanium fin 702, which will be the final silicon germanium fin of the p-type FET that results from the fabrication process described herein. Because the lattice constant of epitaxially grown silicon germanium fin 702 matches the lattice constant of the surrounding silicon, the silicon germanium fin 702 is compressively strained. Because the length Lf and the width Wf dimensions defined within sidewall spacer 502 were transferred to trench 604, epitaxially growing silicon germanium fin 702 within trench 604 transfers the length Lf and the width Wf dimensions (i.e., the desired final silicon germanium fin dimensions) to silicon germanium fin 702. Accordingly, there is no need to cut silicon germanium fin 702 in order to obtain the length Lf and the width Wf dimensions, and compressive strain is maintained throughout silicon germanium fin 702.

Additionally, silicon shield 602 surrounds a circumference of silicon germanium fin 702. Accordingly, silicon shield 602 protects silicon germanium fin 702 from downstream fabrication processes (cleaning, etching, etc.) that would, without the presence of silicon shield 602, result in a loss of some of silicon germanium fin 702. Thus, downstream fabrication processes impact silicon shield 602 instead of impacting silicon germanium fin 702. Because the thickness of silicon shield 602 matches or exceeds the expected silicon loss that will result downstream fabrication processes to form a p-type FET, silicon shield 602 has sufficient thickness to be present and protect silicon germanium fin 702 throughout the downstream fabrication processes.

Figure 8A:
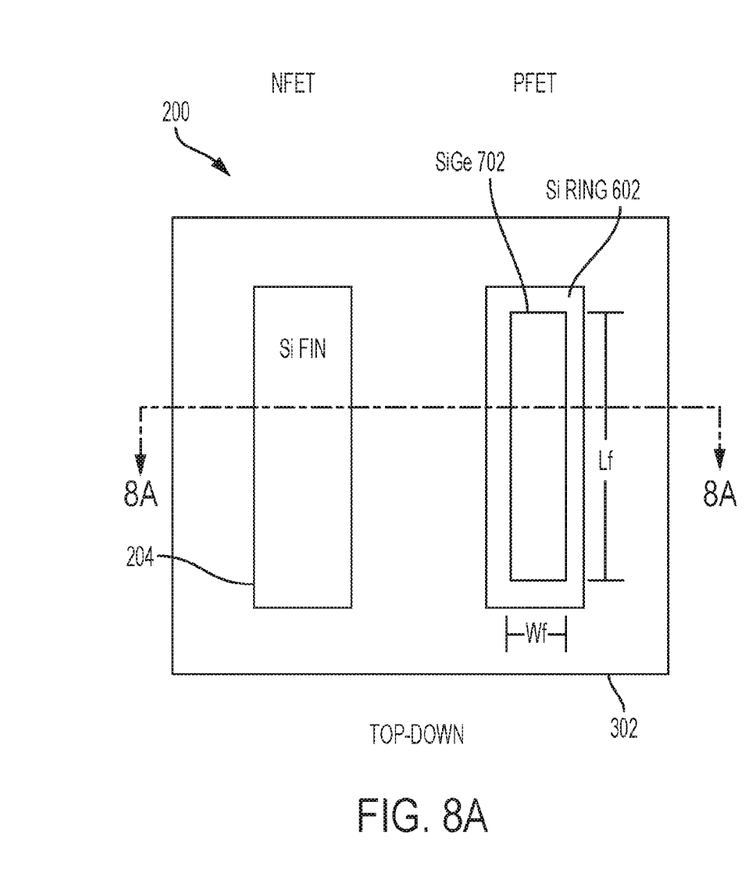
FIG. 8A depicts a top-down view of an intermediate fabrication stage for a fin configuration according to one or more embodiments.
Figure 8B:
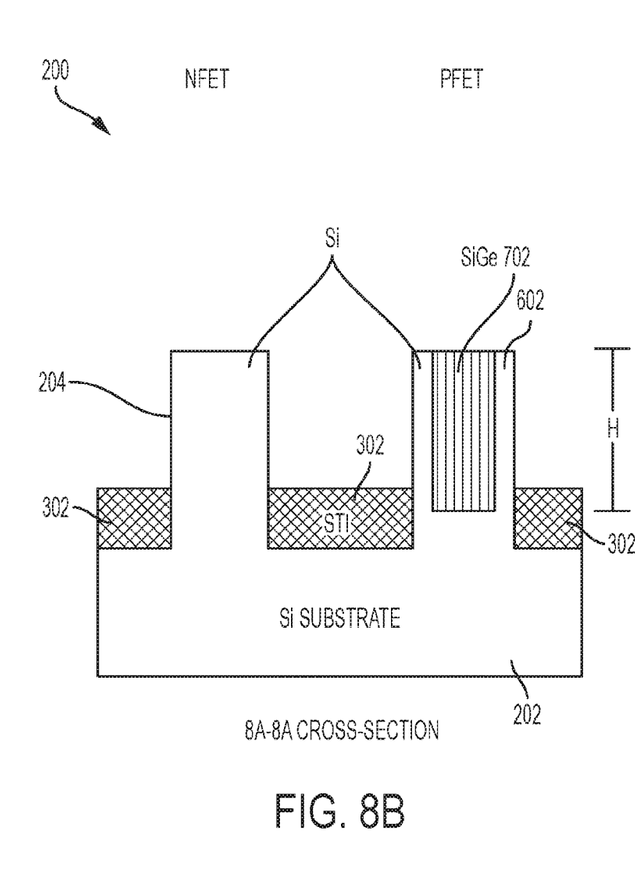
FIG. 8B depicts a cross-sectional view of the fin shown in FIG. 8A, taken along line 8A-84A.

FIG. 8A depicts a top-down view of features 200 after another intermediate fabrication stage according to one or more embodiments. FIG. 8B depicts a cross-sectional view of features 200 shown in FIG. 8A, taken along line 8A-8A. As best shown in FIG. 8B, STI 302 is etched back, the hard mask 208 over silicon fin 204 is removed, and the sidewall spacers 502 over silicon shield 602 are removed.

After the processing operations illustrated in FIGS. 8A and 8B, source, drain and gate fabrication techniques are applied to the unstrained silicon fin 204 to form an NFET, and source, drain and gate fabrication techniques are applied to the combined silicon shield 602 and strained silicon germanium fin 702 to form a PFET. For ease of illustration and explanation, only the source, drain and gate fabrication processes applied to the silicon shield 602 and silicon germanium fin 702 are shown in FIGS. 9A through 11C and described in detail herein.

Figure 9A:
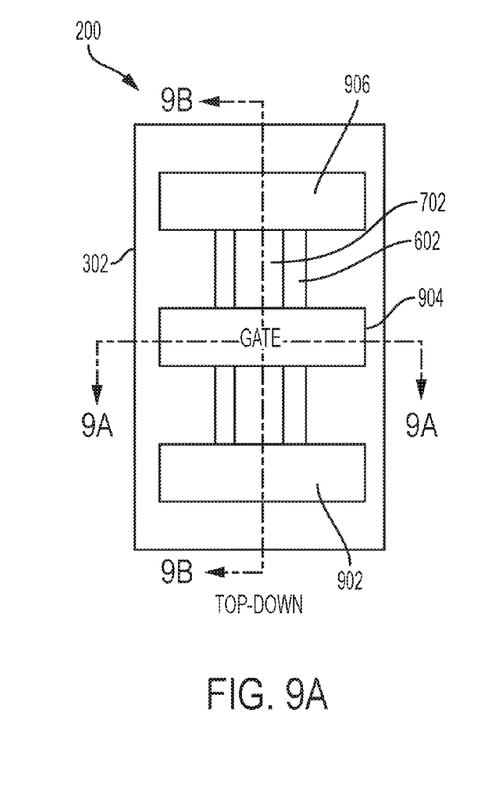
FIG. 9A depicts a top-down view of an intermediate fabrication stage for a fin configuration according to one or more embodiments.
Figure 9B:
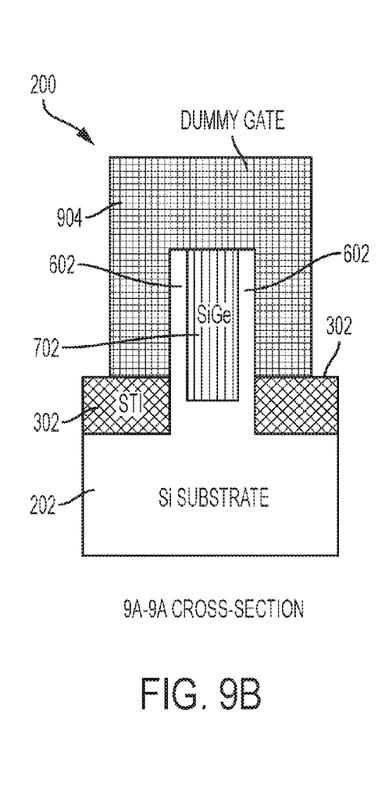
FIG. 9B depicts a cross-sectional view of the fin shown in FIG. 9A, taken along line 9A-9A.
Figure 9C:
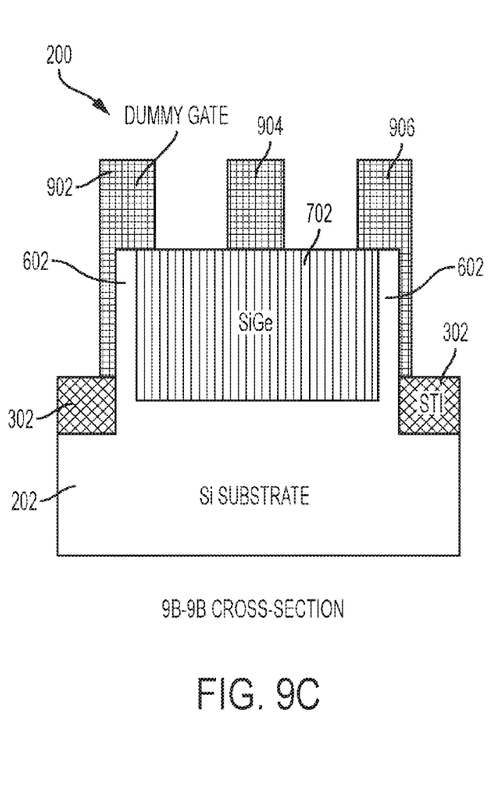
FIG. 9C depicts a cross-sectional view of the fin shown in FIG. 9A, taken along line 9B-9B.

FIG. 9A depicts a top-down view of the PFET region of features 200 after another intermediate fabrication stage according to one or more embodiments. FIG. 9B depicts a cross-sectional view of the PFET region of features 200 shown in FIG. 9A, taken along line 9A-9A. FIG. 9C depicts a cross-sectional view of the PFET region of features 200 shown in FIG. 9A, taken along line 9B-9B. As best shown in FIG. 9C, dummy gates 902, 904, 906 are formed around end sections and a middle section of silicon shield 602 and silicon germanium fin 702. In subsequent process operations, dummy gates 902, 904, 906 are replaced with metal gate structures, and the metal gate structure that replaces dummy gate 904 will function as the active gate 904 of the PFET. Although two non-active dummy gates 902, 906 are shown, any number of non-active dummy gates can be provided. In some embodiments, each dummy gate can include a dummy gate dielectric (e.g., silicon oxide), a dummy gate core (e.g., amorphous or polycrystalline silicon), and a dielectric gate cap (e.g., silicon nitride, silicon oxide, or combination of silicon oxide, silicon nitride, or any other suitable materials).

Figure 10A:
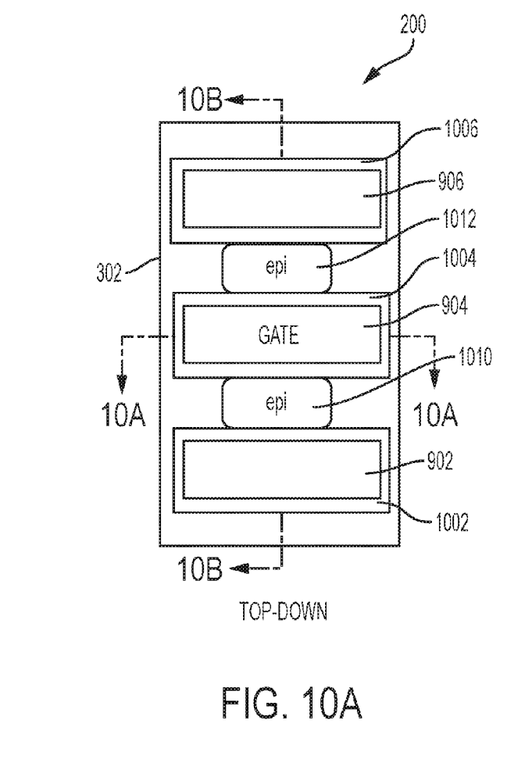
FIG. 10A depicts a top-down view of an intermediate fabrication stage for a fin configuration according to one or more embodiments.
Figure 10B:
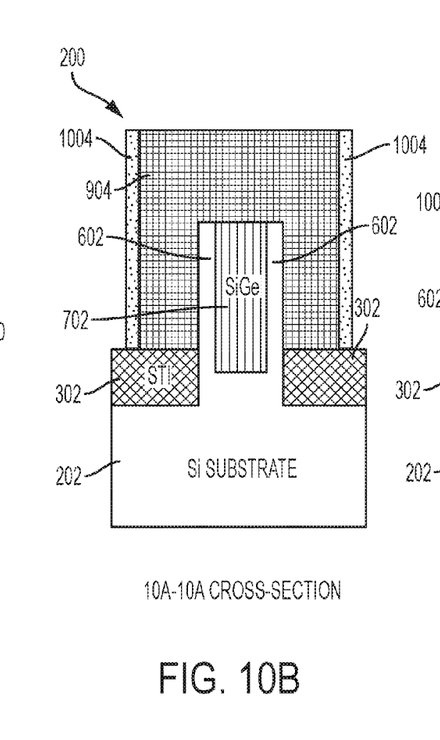
FIG. 10B depicts a cross-sectional view of the fin shown in FIG. 10A, taken along line 10A-10A.
Figure 10C:
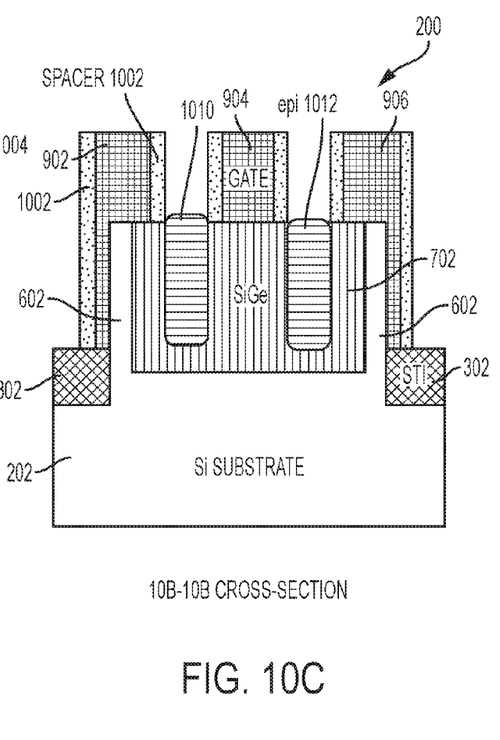
FIG. 10C depicts a cross-sectional view of the fin shown in FIG. 10A, taken along line 10B-10B.

FIG. 10A depicts a top-down view the PFET region of features 200 after another intermediate fabrication stage according to one or more embodiments. FIG. 10B depicts a cross-sectional view of the PFET region of features 200 shown in FIG. 10A, taken along line 10A-10A. FIG. 10C depicts a cross-sectional view of the PFET region of features 200 shown in FIG. 10A, taken along line 10B-10B. As best shown in FIG. 10C, offset spacers 1002, 1004, 1006 are formed along the sidewalls of dummy gates 902, 904, 906, as shown. Offset spacers 1002, 1004, 1006 can be formed using a spacer pull down formation process. Offset spacers 1002, 1004, 1006 can also be formed by a conformal deposition of a dielectric material (e.g., silicon oxide, silicon nitride, silicon oxynitride, SiBCN, SiOCN, SiOC, or any suitable combination of those materials) followed by a direction etch (e.g., RIE)

As best shown in FIG. 10C, source/drain (SD) regions 1010, 1012 are grown over portions of the silicon shield 602 and silicon germanium fin 702 using an epitaxial growth process. The source/drain regions 1010, 1012 are formed by an epitaxial growth process that deposits a crystalline overlayer of semiconductor material onto the exposed crystalline seed material of the exposed silicon shield 602 and silicon germanium fin 702 to form the source/drain regions 1010, 1012.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 11A:
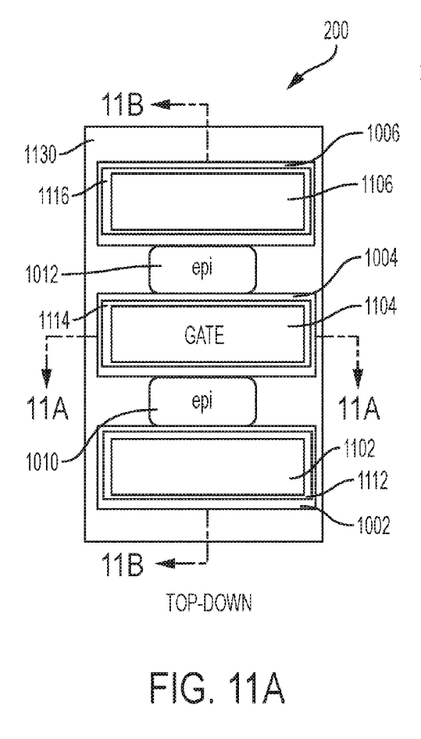
FIG. 11A depicts a top-down view of an intermediate fabrication stage for a fin configuration according to one or more embodiments.
Figure 11B:
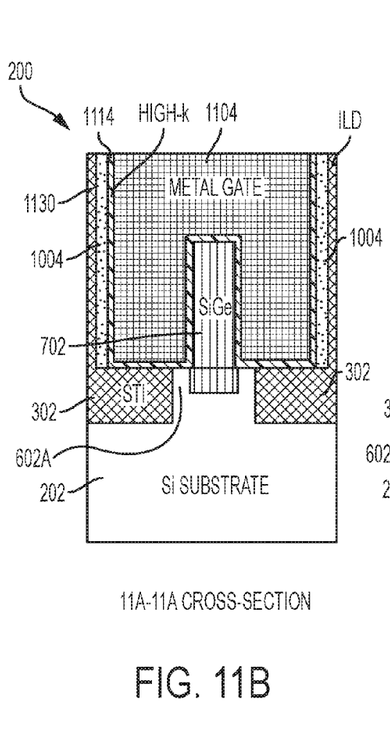
FIG. 11B depicts a cross-sectional view of the fin shown in FIG. 11A, taken along line 11A-11A.
Figure 11C:
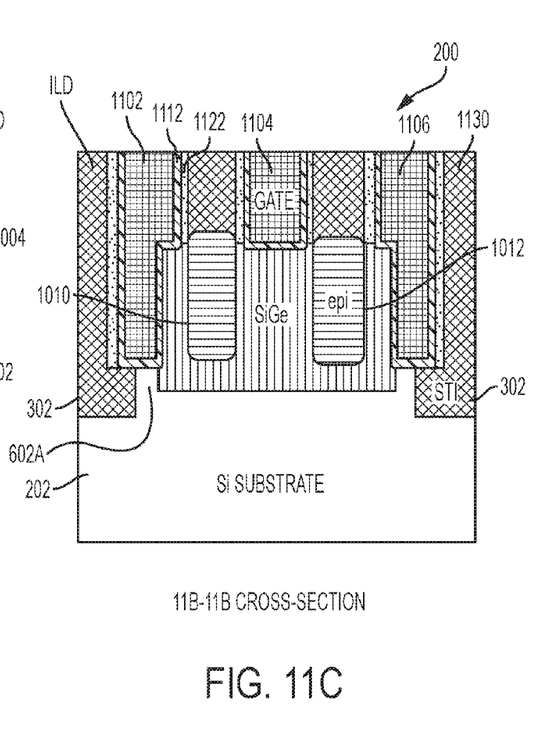
FIG. 11C depicts a cross-sectional view of the fin shown in FIG. 11A, taken along line 11B-11B.
Figure 12:
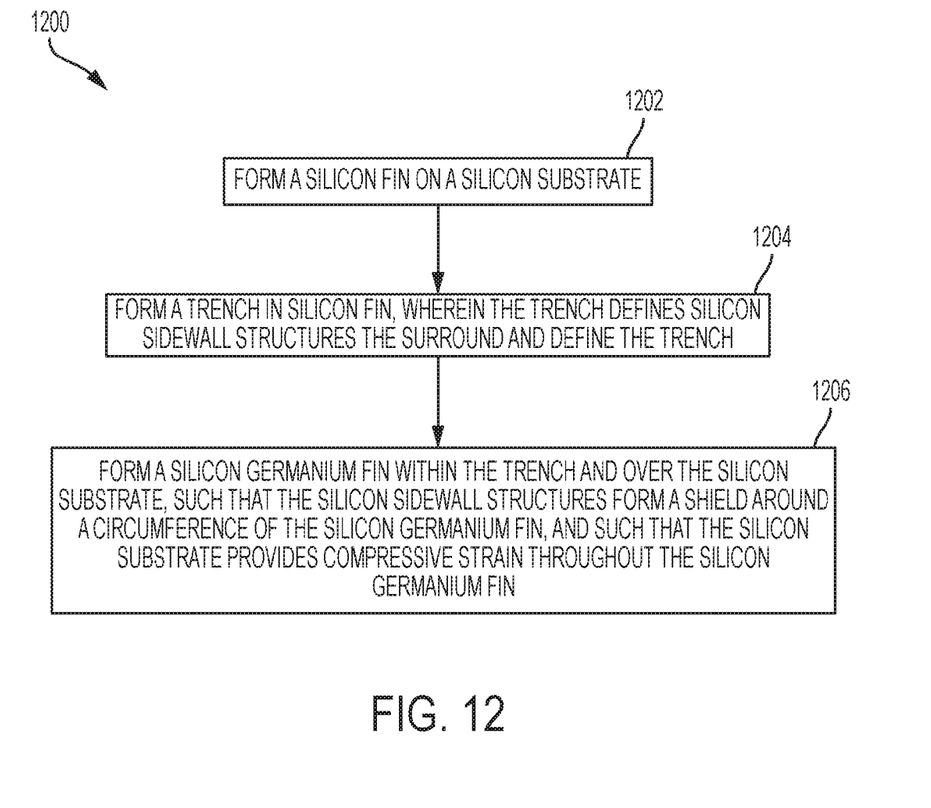
FIG. 12 depicts a flow diagram illustrating a methodology according to one or more embodiments.

FIG. 11A depicts a top-down view of the PFET region of features 200 after another intermediate fabrication stage according to one or more embodiments. FIG. 11B depicts a cross-sectional view of the PFET region of features 200 shown in FIG. 11A, taken along line 11A-11A. FIG. 11C depicts a cross-sectional view of the PFET region of features 200 shown in FIG. 11A, taken along line 11B-11B. As best shown in FIG. 11C, a gate-late fabrication technique has been used to replace dummy gates 902, 904, 906 (shown in FIGS. 10A to 10C) with metal gate structures having metal conductor regions 1102, 1104, 1106, high-k dielectric layers 1112, 1114, 1116, and an interlayer dielectric (ILD) layer 1130, configured and arranged as shown.

Dummy gates 902, 904, 906 can be removed by any suitable etching process or combination of processes such as wet etch, dry etch, chemical oxide removal (COR) to form a trench. ILD 1130 is formed before replacing the dummy gates with a metal gate. Specifically, an ILD layer 1130 (e.g., a dielectric material such as oxide, nitride, SiOC or any combination of any suitable dielectric materials) is deposited followed by a planarization operation such as chemical mechanical polishing (CMP). Then the dummy gates 902, 904, 906 are removed and replaced by high-k gate dielectric layers 1112, 1114, 1116 and metal gate structures having metal conductor regions 1102, 1104, 1106. Gate dielectric material and gate metal can then be deposited within the trench. Suitable gate dielectrics include but are not limited to silicon oxide, silicon nitride, silicon oxynitride, boron nitride, high-k materials, or any combination of these materials. Examples of suitable high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum or aluminum.

Suitable gate conductor materials include but are not limited to doped polycrystalline or amorphous silicon, germanium, silicon germanium, a metal (e.g., tungsten, titanium, tantalum, ruthenium, zirconium, cobalt, copper, aluminum, lead, platinum, tin, silver, and gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, and nickel silicide), carbon nanotubes, conductive carbon, graphene, or any suitable combination of these materials. The conductive material may further include dopants that are incorporated during or after deposition.

The gate structure may further include a gate work function setting layer (not shown) between the gate dielectric and the gate conductor. The gate work function setting layer can be a metallic compound including but not limited to: (i) nitrides (e.g., titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), and niobium nitride (NbN)); (ii) carbides (e.g., titanium carbide (TiC), titanium aluminum carbide (TiAlC), tantalum carbide (TaC), and hafnium carbide (HfC)); and (iii) combinations thereof.

Processes for forming the gate dielectric and the gate conductors include but are not limited to atomic layer deposition (ALD), molecular layer deposition (MLD), chemical vapor deposition (CVD), physical vapor deposition, sputtering, plating, evaporation, ion beam deposition, electron beam deposition, laser assisted deposition, chemical solution deposition, or any combination of those methods.

As best shown in FIGS. 11B and 11C, except for a remnant silicon shield 602A, most of the silicon shield 602 in the channel region (i.e., under dummy gate 904) and at the ends of the silicon germanium fin 702 is consumed during the replacement metal gate fabrication process while the silicon germanium fin 702 remains intact. If needed, any remaining silicon on the silicon germanium fin 702 surface can be removed either by atomic layer etch, or by ozone oxidation followed by a hydrofluoric acid (HF) etch. It is noted that portions of the silicon shield 602 are still present under the source/drain epitaxial regions 1010, 1012. The remnant silicon shield 602A, which includes a bottom portion that is integral with the silicon substrate 202, is present in the final PFET device and continues to maintain compressive strain in the silicon germanium fin 702, as well as provide protection to the bottommost portion of the silicon germanium fin 702 against being attacked by aspects of the replacement metal gate fabrication process.

FIG. 12 depicts a flow diagram illustrating a methodology 1200 according to one or more embodiments. Methodology 1200 begins at block 1202 by forming a silicon fin on a silicon substrate. Block 1204 forms a trench in the silicon fin, wherein the trench defines silicon sidewall structures that surround and define the trench. Block 1206 forms a silicon germanium fin within the trench and over the silicon substrate, such that the silicon sidewall structures form a shield around a circumference of the silicon germanium fin, and such that the silicon substrate provides compressive strain throughout the silicon germanium fin. The methodology 1200 is one example of how a SiGe fin can be formed with compressive strain in accordance with aspects of the present invention. In some applications of aspects of the present invention, it is desirable to provide a tensile strained fin on a relaxed substrate. The same concept illustrated in methodology 1200 (and in FIGS. 2A to 11C) could be implemented using a device configuration where a tensile strained Si fin is formed on a relaxed SiGe substrate (using for example a relaxed SiGe shield).

Thus it can be seen from the forgoing detailed description embodiments of the present invention provide a feature fabrication methodology for fabricating a strained silicon germanium fin having the desired dimensions but minimizing the relaxation or removal of compressive strain from the ends of the fin. In one or more embodiments, a protective silicon shield (or ring or shell) is provided around a circumference of the strained silicon germanium fin. The dimensions of an inner surface of the silicon shield define the dimensions of the silicon germanium fin. By selecting the dimensions of the inner surface of the silicon shield to match the desired dimensions of the silicon germanium fin in the final FET device, the silicon germanium fin does not have to be cut to the final FET dimension requirements. Because the strained silicon germanium fin does not have to be cut, compression strain is maintained throughout the strained silicon germanium fin. In addition, the silicon shield protects the silicon germanium fin from downstream FET fabrication processes such as cleaning and etching that would otherwise result in excessive silicon germanium thinning.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming features of a semiconductor device, the method comprising:
    forming a first feature comprising a first type of semiconductor material; and
    forming an enclosure structure comprising a second type of semiconductor material;
    wherein the first feature comprises first feature sidewall surfaces extending around a circumference of the first feature;
    wherein the enclosure structure is adjacent at least a portion of the first feature sidewall surfaces and extends around the circumference of the first feature.

2. The method of claim 1, wherein forming the enclosure structure comprises:
    forming a second feature comprising the second type of semiconductor material; and
    forming a trench in the second feature;
    wherein forming the trench defines sidewalls structures in the second feature that surround the trench.

3. The method of claim 2, wherein forming the first feature comprises depositing the first type of material in the trench.

4. The method of claim 3, wherein depositing the first type of material in the trench comprises epitaxially growing the first type of material in the trench.

5. The method of claim 3, wherein the second feature comprises a fin.

6. The method of claim 3, wherein the second feature is formed from a substrate comprising the second type of semiconductor material.

7. The method of claim 6, wherein:
    the first type of semiconductor material comprises silicon germanium; and
    the second type of semiconductor material comprises silicon.

8. A method of forming features of a semiconductor device, the method comprising:
    forming a first feature on a substrate, wherein the first feature and the substrate comprise a first type of semiconductor material;
    forming a trench in the first feature, wherein the trench defines sidewall structures in the first feature that surround the trench; and
    forming a second feature comprising a second type of semiconductor material;
    wherein forming the second feature comprises filling the trench with the second type of material such that the sidewall structures in the first feature extend around a circumference of the second feature.

9. The method of claim 8, wherein filling the trench comprises depositing the second type of material in the trench.

10. The method of claim 9, wherein depositing the second type of material comprises epitaxially growing the second type of material in the trench.

11. The method of claim 8, wherein:
    the first feature comprises a first fin; and
    the second feature comprises a second fin.

12. The method of claim 8, wherein:
    the first type of semiconductor material comprises silicon; and
    the second type of semiconductor material comprises silicon germanium.

13. The method of claim 8 further comprising forming a gate structure that:
    extends over a portion of the sidewall structures in the first feature; and
    extends over a portion of the second feature.

14. The method of claim 13 wherein forming the gate structure comprises applying etch processes that at least partially etch the sidewall structures in the first feature but do not etch portions of the second feature that are covered by the sidewall structures in the first feature.

15. The method of claim 8 further comprising forming a third feature on the substrate, wherein the third feature and the substrate comprise the first type of semiconductor material.

16. The method of claim 15 further comprising:
    forming a first gate structure over a portion of the sidewall structures and over a portion of the second feature; and
    forming a second gate structure over a portion of the third feature.

17. A semiconductor device comprising:
    a substrate comprising a first type of semiconductor material;
    a first feature on the substrate, wherein the first feature comprises the first type of semiconductor material;
    a trench in the first feature, wherein the trench defines sidewall structures in the first feature that surround the trench; and
    a second feature within the trench, wherein the second feature comprises a second type of semiconductor, wherein the sidewall structures in the first feature extend around a circumference of the second feature.

18. The semiconductor device of claim 17, wherein:
    the first feature comprises a first fin;
    the second feature comprises a second fin;
    the first type of semiconductor material comprises silicon; and
    the second type of semiconductor material comprises silicon germanium.

19. The semiconductor device of claim 17 further comprising a third feature on the substrate, wherein the third feature comprises the first type of semiconductor material.

20. The semiconductor device of claim 19 further comprising:
    a first gate structure over a portion of the sidewall structures and a portion of the second feature; and
    a second gate structure over a portion third feature.

* * * * *